United States Patent [19]

Miyazaki

[11] Patent Number: 5,177,590
[45] Date of Patent: Jan. 5, 1993

[54] SEMICONDUCTOR DEVICE HAVING BONDING WIRES

[75] Inventor: Toshihiro Miyazaki, Kitakyushu, Japan

[73] Assignee: Kabushiki Kaisha Toshiba, Kawasaki, Japan

[21] Appl. No.: 772,593

[22] Filed: Oct. 4, 1991

Related U.S. Application Data

[63] Continuation of Ser. No. 605,355, Oct. 30, 1990, abandoned.

[30] Foreign Application Priority Data

Nov. 8, 1989 [JP] Japan .................. 1-290338

[51] Int. Cl.⁵ .............................. H01L 9/00
[52] U.S. Cl. ........................ 257/784; 257/787
[58] Field of Search ............. 357/65, 68, 72, 84

[56] References Cited

U.S. PATENT DOCUMENTS

| 3,015,760 | 1/1962 | Weil | 357/74 |
| 3,050,667 | 8/1962 | Emeis | 357/71 |
| 3,204,158 | 8/1965 | Schreiner et al. | 357/71 |
| 3,256,471 | 6/1966 | Cowles | 357/74 |
| 3,416,048 | 12/1968 | Spickenreuther | 357/71 |
| 3,484,660 | 12/1969 | Rossler | 357/74 |
| 3,517,439 | 6/1970 | Manko | 357/68 |

FOREIGN PATENT DOCUMENTS

| 0222227 | 7/1962 | Japan . | |
| 1-184856 | 7/1989 | Japan | 357/65 |

Primary Examiner—Andrew J. James
Assistant Examiner—Viet Q. Nguyen
Attorney, Agent, or Firm—Finnegan, Henderson, Farabow, Garrett and Dunner

[57] ABSTRACT

In a semiconductor device, a semiconductor element is electrically connected to an inner lead portion by means of a bonding wire having almost regularly repeated concaves and convexes on its outer peripheral surface. Thus, the contact area between the bonding wire and the mold resin is increased, whereby the adhesion between the wire and resin is improved and a gap is hardly produced between the wire and resin.

9 Claims, 2 Drawing Sheets

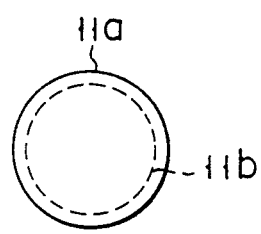
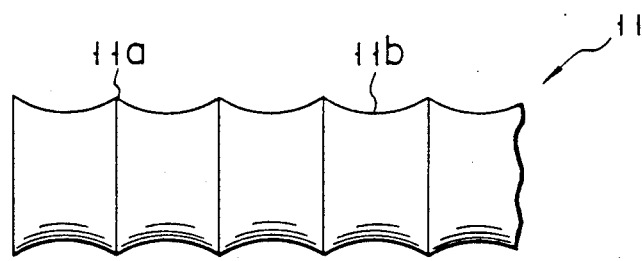
FIG. 1A  FIG. 1B
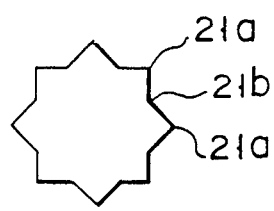
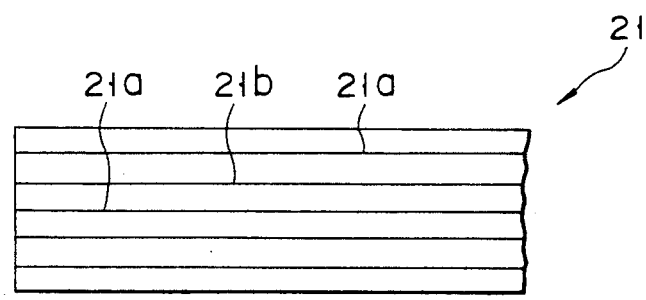
FIG. 2A  FIG. 2B
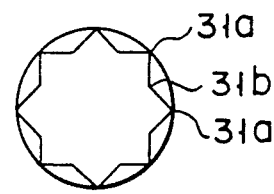
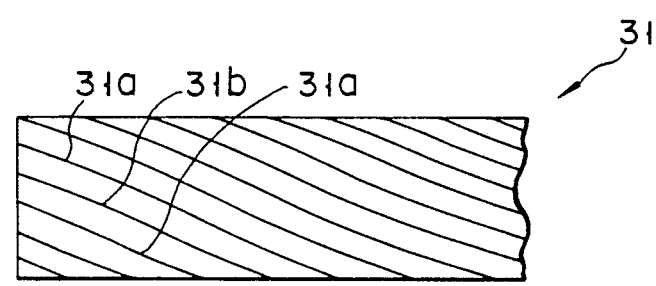
FIG. 3A  FIG. 3B

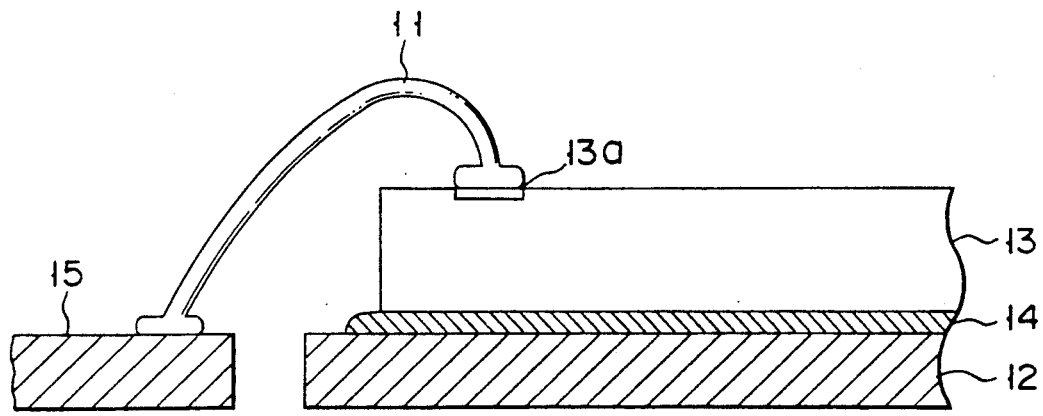
F I G. 4

SEMICONDUCTOR DEVICE HAVING BONDING WIRES

This application is a continuation of application Ser. No. 07/605,355, filed Oct. 30, 1990 now abandoned.

BACKGROUND OF THE INVENTION

1. Field of the Invention

The present invention relates generally to a semiconductor device having bonding wires, and in particular to the shape of a bonding wire for electrically connecting a semiconductor element and an inner lead portion.

2. Description of the Related Art

In the field of semiconductor devices, it has become important more and more to enhance moisture resistance in accordance with the reduction in the size of the device package and the lead pitch.

In fabricating a semiconductor device which is sealed with resin, bonding wires are used as a means for electrically connecting a semiconductor chip and a lead frame. FIG. 5 shows a conventional bonding wire 1 having a circular cross section. The peripheral surface of the wire 1 is smooth. The wire 1 is made of gold, aluminum alloy, copper alloy, etc.

When a semiconductor device assembled by use of a bonding wire having a cylindrical smooth peripheral surface is molded with sealing resin, adhesion between the mold resin and the lead frame or bonding wire is not satisfactory. When the molded semiconductor device is subjected to an environmental test or it is actually used, moisture enters through a gap between the mold resin and the lead frame and then through a gap between the resin and the bonding wire, thus reaching the semiconductor element. As a result, there is a concern that the semiconductor element may be corroded and the characteristics of the element may be deteriorated. Under this situation, various techniques of preventing the entering of moisture have been proposed, in which the shape of a lead frame is improved. However, the bonding wire has not been improved at all.

SUMMARY OF THE INVENTION

An object of the present invention is to provide a semiconductor device wherein the adhesion between a bonding wire and mold resin is improved, thereby reducing the possibility of corrosion of a semiconductor element due to moisture entering through a gap between the wire and resin and enhancing the reliability of the semiconductor device.

Another object of the invention is to lower the surface resistance per unit length by increasing the surface area of a bonding wire, thus providing a bonding wire having a low resistance.

These objects are achieved by a semiconductor device wherein a bonding wire having almost regularly repeated concaves and convexes on its outer surface.

The repeated concaves and convexes are formed such that they appear in a cross-sectional plane parallel to the longitudinal axis of the bonding wire, or in a cross-sectional plane perpendicular to the longitudinal axis of the wire, or in both planes.

Because the bonding wire according to the present invention has concaves and convexes on its outer peripheral surface, adhesion between the bonding wire and the mold resin is improved, and a gap is hardly produced therebetween. In addition, there is a difference in thermal expansion between the resin and the metal wire. Thus, in particular, when the concaves and convexes are formed along the longitudinal axis of the wire, the resin is brought into pressurized contact with the concaves of the wire, and movement of moisture can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a cross-sectional view of a bonding wire according to a first embodiment of the present invention;

FIG. 1B is a side view of the bonding wire according to the first embodiment shown in FIG. 1;

FIG. 2A and FIG. 2B are a cross-sectional view and a side view of a bonding wire according to a second embodiment of the invention;

FIGS. 3A and 3B are a cross-sectional view and a side view of a bonding wire according to a third embodiment of the invention;

FIG. 4 is a cross-sectional view of an important portion of a semiconductor device using the bonding wire of the present invention.

Figure 5:
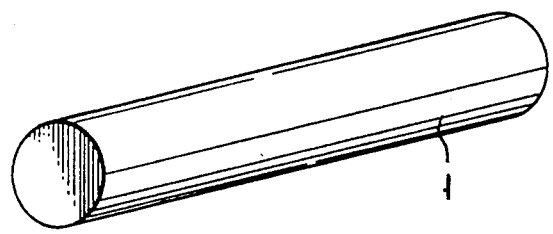
FIG. 5 is a perspective view of a bonding wire used in a conventional semiconductor device.

Embodiments of the present invention will now be described with reference to the accompanying drawings.

DETAILED DESCRIPTION OF THE PREFERRED EMBODIMENTS

FIG. 4 is a cross-sectional view of an important portion of a semiconductor device using bonding wires, which has not yet been molded with resin. A semiconductor element 13 is mounted on a bed portion 12 of a lead frame, with a mounting material 14 such as solder interposed therebetween. An electrode 13a of the semiconductor element 13 is connected to an inner lead portion 15 of the lead frame by means of a bonding wire 11.

FIG. 1A and FIG. 1B are a cross-sectional view and a side view of the bonding wire 11 according to a first embodiment of the present invention. The bonding wire 11 of the first embodiment has a circular cross section, and an outer diameter varying regularly along the longitudinal axis thereof. The bonding wire 11 is shaped by increasing and decreasing the speed at which the wire 11 is drawn at regular intervals.

FIG. 2A and FIG. 2B are a cross-sectional view and a side view of a bonding wire 21 according to a second embodiment of the invention. As is shown in FIG. 2A, the bonding wire 21 has a star-shaped cross section. Ridges 21a and grooves 21b are formed regularly to extend in parallel in the longitudinal direction, as is shown in FIG. 2B. In the manufacturing process, the bonding wire 21 is drawn from a star-shaped die.

FIG. 3A and FIG. 3B are a cross-sectional view and a side view of a bonding wire 31 according to a third embodiment of the invention. As is shown in FIG. 3A, the bonding wire 31 has a star-shaped cross section. Unlike in the second embodiment, ridges 31a and grooves 31b extend spirally. In the manufacturing process, the bonding wire 31 is drawn from a star-shaped die and is simultaneously twisted.

The bonding wire according to the present invention has concaves and convexes on its outer peripheral surface. This increases the contact area between the bonding wire and the mold resin. Thus, adhesion between the bonding wire and the mold resin is improved, and a gap is hardly produced therebetween. In addition, where repeated concaves and convexes are formed in the bonding wire in the longitudinal direction, the resin is brought into pressurized contact with the grooves of the wire by virtue of the difference in thermal expansion between the resin and the metal wire, and movement of moisture is prevented. In the conventional art, there are problems in reliability, such as corrosion and deterioration of characteristics. The present invention can provide a high-quality semiconductor device.

The bonding wires according to the second and third embodiments shown in FIGS. 2 and 3 have another advantage. In these embodiments, the surface resistance of the wire can be reduced, and the use of higher frequencies can be made possible. The resistance R of the bonding wire in a high-frequency region is given by the equation:

$$R = L/(2\pi r) \cdot \rho_r$$

where
L: the length of the bonding wire,
r: the radius of the bonding wire,
$\rho_r$: the resistivity of the material of the bonding wire, and
$2\pi r$: the circumferential length of the bonding wire.

From the above equation, it is understood that the surface resistance per unit length lowers as the circumferential length of the bonding wire increases. According to this advantage of the present invention, the circumferential length of the wire increases, and the surface resistance per unit length decreases. Therefore, the present invention can provide a bonding wire having a low resistance in a ultra high frequency.

It is further understood by those skilled in the art that the foregoing description is related to preferred embodiments of the device and that various changes and modifications may be made in the invention without departing from the spirit and scope thereof.

I claim:

1. A semiconductor device comprising:
a semiconductor element;
an inner lead arranged in proximity to the semiconductor element;
a bonding wire having one end portion directly connected to the inner lead, and another end portion directly connected to the semiconductor element; and
a resin encapsulating the semiconductor element, the inner lead and the bonding wire;
wherein the bonding wire comprises a unitary wire element that has repeated concave/convex sections on its outer surface for enhancing adhesion between the resin and the bonding wire.

2. A semiconductor device comprising:
a semiconductor element;
an inner lead arranged in proximity to the semiconductor element;
a bonding wire having one end portion directly connected to the inner lead, and another end portion directly connected to the semiconductor element; and
a resin encapsulating the semiconductor element, the inner lead and the bonding wire;
wherein the bonding wire comprises a unitary wire element that has repeated concave/convex portions on its outer surface for enhancing adhesion between the resin and the bonding wire, said repeated concave/convex portions are formed along the longitudinal axis of the bonding wire, and the bonding wire has a circular cross-section and an outer diameter varying regularly along the longitudinal axis thereof.

3. A semiconductor device comprising:
a semiconductor element;
an inner lead arranged near the semiconductor element;
a bonding wire having one end portion directly connected to the inner lead, and another end portion directly connected to the semiconductor element; and
a resin encapsulating the semiconductor element, the inner lead and the bonding wire;
wherein the bonding wire comprises a unitary wire element that has repeated concave/convex portions on its outer surface for enhancing adhesion between the resin and the bonding wire, and said repeated concave/convex portions appear both in a cross-sectional plane parallel to the longitudinal axis of the bonding wire and in a cross-sectional plane perpendicular to the longitudinal axis of the bonding wire.

4. A semiconductor device comprising:
a semiconductor element;
an inner lead arranged in proximity to the semiconductor element;
a bonding wire having one end portion directly connected to the inner lead, and another end portion directly connected to the semiconductor element; and
a resin encapsulating the semiconductor element, the inner lead and the bonding wire;
wherein the bonding wire comprises a unitary wire element that has repeated concave/convex portions on its outer surface for enhancing adhesion between the resin and the bonding wire, the bonding wire has a star-shaped cross-section, and said concave/convex portions are grooves and ridges extending spirally along the longitudinal axis of the bonding wire.

5. The device according to claim 1, wherein said repeated concave/convex sections are formed along the longitudinal axis of the bonding wire.

6. The device according to claim 2, wherein the bonding wire has a circular cross section, and has an outer diameter varying regularly along the longitudinal axis thereof.

7. The device according to claim 1, wherein the bonding wire comprises a unitary wire element that has a star-shaped cross section, and said concave/convex sections are grooves and ridges extending along the longitudinal axis of the bonding wire.

8. The device according to claim 1, wherein said repeated concave/convex sections appear both in a cross-sectional plane parallel to the longitudinal axis of the bonding wire and in a cross-sectional plane perpendicular to the longitudinal axis of the bonding wire.

9. The device according to claim 8, wherein the bonding wire comprises a unitary wire element that has a star-shaped cross section, and said concave/convex sections are grooves and ridges extending spirally along the longitudinal axis of the bonding wire.

* * * * *

UNITED STATES PATENT AND TRADEMARK OFFICE
CERTIFICATE OF CORRECTION

PATENT NO. : 5,177,590
DATED : January 05, 1993
INVENTOR(S) : Toshihiro Miyazaki It is certified that error appears in the above-identified patent and that said Letters Patent is hereby corrected as shown below:

Claim 6, column 4, line 60, change "claim 2" to --claim 5--.

Signed and Sealed this

Twenty-eighth Day of December, 1993

Attest:

BRUCE LEHMAN

Attesting Officer    Commissioner of Patents and Trademarks